United States Patent [19]
Katz

[11] 4,438,397
[45] Mar. 20, 1984

[54] TEST PIN

[75] Inventor: Jonathon H. Katz, Brookline, Mass.

[73] Assignee: Teradyne, Inc., Boston, Mass.

[21] Appl. No.: 388,436

[22] Filed: Jun. 14, 1982

Related U.S. Application Data

[63] Continuation of Ser. No. 107,027, Dec. 26, 1979.

[51] Int. Cl.³ .............................................. G01R 1/06
[52] U.S. Cl. ................................ 324/158 P; 324/72.5
[58] Field of Search ............... 324/158 P, 158 F, 72.5; 267/167; 200/275, 290

[56] References Cited

U.S. PATENT DOCUMENTS

| 3,435,168 | 3/1969 | Cooney | 200/166 |
| 4,105,970 | 8/1978 | Katz | 324/158 |

*Primary Examiner*—Ernest F. Karlsen

[57] ABSTRACT

Test pins with sidewardly biased plungers to insure electrical contact.

2 Claims, 2 Drawing Figures

TEST PIN

This is a continuation of application Ser. No. 107,027, filed on Dec. 26, 1979.

FIELD OF THE INVENTION

This invention relates to test pins useful, for example, in testing the electrical characteristics of printed circuit boards (PCB's).

BACKGROUND OF THE INVENTION

Spring-loaded test pins are known in the art. My U.S. Pat. No. 4,105,970 discloses a test pin assembly having a cylindrical plunger with a PCB-contacting crown, the plunger being slidably mounted within a tubular housing and spring biased. A problem that has been noted with such a construction is that occasionally there will be insufficient contact force between the lower portion of the plunger and the housing, resulting in lack of electrical contact between the PCB and the analyzing instrument.

SUMMARY OF THE INVENTION

I have discovered that improved electrical contact can be provided for a test pin assembly by including means to bias the plunger, thereby improving electrical contact between the plunger and housing. In a preferred embodiment the upper portion of the spring that engages the plunger is tilted at an angle prior to its connection to the plunger in the assembly of the test pin and is off-center.

DESCRIPTION OF PREFERRED EMBODIMENTS

I turn now to the description of the presently preferred embodiments of the invention.

DRAWINGS

STRUCTURE

Figure 1:
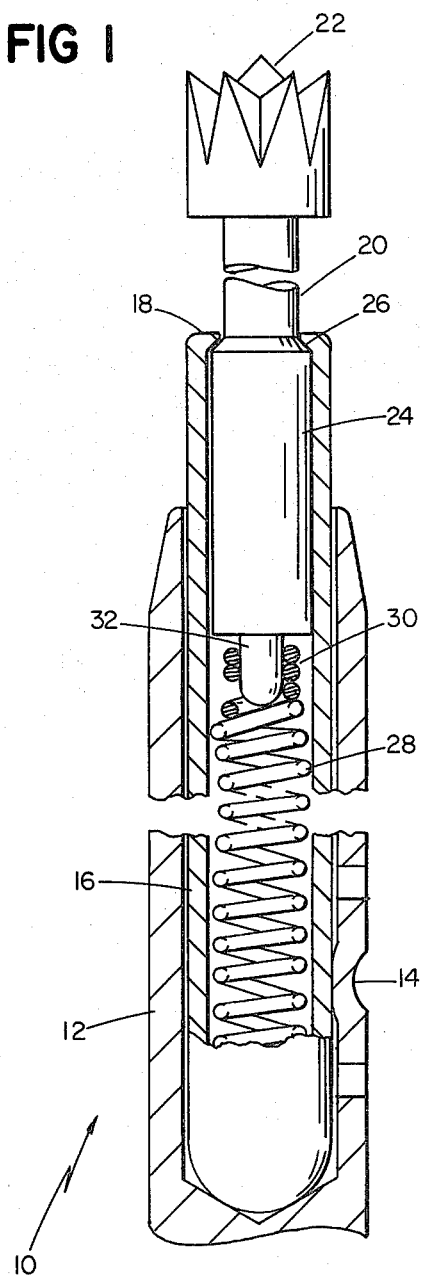
FIG. 1 is a vertical sectional view, partially broken away, of a portion of a test pin assembly of the invention.
Figure 2:
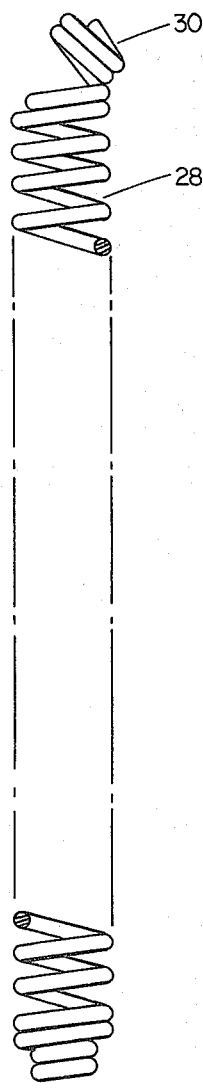
FIG. 2 is a side elevation view of the spring of one of the preferred embodiments.

There is shown in FIG. 1 portion 10 of an upper assembly of a test pin similar to that disclosed in my U.S. Pat. No. 4,105,970, which is hereby incorporated by reference. Tubular housing 12 has dimple 14 for frictionally engaging insert 16, which has edge 18 of narrow diameter. Plunger 20 has pointed crown 22 on its upper end, large diameter portion 24 and tapered portion 26, which is biased against upper edge 18 by spring 28. Housing 12, insert 16, and plunger 20 are all made of hardened beryllium copper, plated with nickel and then gold. Spring 28 is made of stainless steel 5/1000 of an inch in diameter with a total of 31 turns. Spring 28 has two windings 30 at its upper end which are of a smaller diameter and frictionally engage stud 32 of plunger 20. FIG. 1 is a diagrammatic in that the left-hand side of insert 16 is not shown forced against the inner surface of the left-hand wall of housing 12, but in reality it is so forced by dimple 14. Although not evident in FIG. 1, the upper end windings 30 are offset 45° to the right with respect to the rest of the spring (FIG. 2), thereby forcing portion 24 of plunger 20 against the inner surface of the right-hand wall of insert 18.

OPERATION

Operation of test pins is well known in the art. With the test pin of my invention, accidental, occasional undesired open circuits to the test pin crown are prevented.

Improved contact results not only from the forcing of plunger portion 24 against insert 18, but as well because of an electrical path through stud 32, the spring turns gripping it, and the top larger-diameter spring turn diagrammatically shown touching insert 16.

OTHER EMBODIMENTS

In another embodiment, my spring is symmetrical about a single straight line axis, but the stud axis is not coaxial therewith.

What is claimed is:

1. A test pin comprising:
    a tubular shaped housing,
    a plunger with a contacting end and a body portion that is slidably mounted within said housing along the longitudinal axis of said housing,
        said plunger including, at its other end, a stud having a width in a direction transverse to said axis that is smaller than that of said body portion, and
    a spring carried in said housing for yieldingly biasing said plunger along said axis relative to said housing,
        said spring including a winding that grips said stud,
        said winding being characterized in that it has an axis that is at an angle to the longitudinal axis of said spring when said spring is unstressed so that said spring forces said plunger to one side against an inner surface of said housing,
    whereby electrical contact between said plunger and said housing is improved.
2. The test pin of claim 1 wherein said spring has a plurality of windings that grip said stud.

* * * * *